(12) United States Patent
Kim

(10) Patent No.: US 10,943,649 B2
(45) Date of Patent: Mar. 9, 2021

(54) APPARATUS AND METHOD FOR CONTROLLING GRADUAL CONDUCTANCE CHANGE IN SYNAPTIC ELEMENT

(71) Applicant: Junsung Kim, Baltimore, MD (US)

(72) Inventor: Junsung Kim, Baltimore, MD (US)

(*) Notice: Subject to any disclaimer, the term of this patent is extended or adjusted under 35 U.S.C. 154(b) by 0 days.

(21) Appl. No.: 16/526,331

(22) Filed: Jul. 30, 2019

(65) Prior Publication Data

US 2021/0035629 A1 Feb. 4, 2021

(51) Int. Cl.
| | | |
|---|---|---|
| *G11C 11/54* | (2006.01) | |
| *G11C 11/16* | (2006.01) | |
| *G11C 13/00* | (2006.01) | |
| *G06N 3/08* | (2006.01) | |
| *G06N 3/063* | (2006.01) | |

(52) U.S. Cl.
CPC ............ *G11C 11/54* (2013.01); *G06N 3/0635* (2013.01); *G06N 3/08* (2013.01); *G11C 11/1673* (2013.01); *G11C 11/1675* (2013.01); *G11C 13/004* (2013.01); *G11C 13/0069* (2013.01); *G11C 2013/005* (2013.01); *G11C 2013/009* (2013.01)

(58) Field of Classification Search
CPC ... G11C 11/54; G11C 13/004; G11C 13/0069; G11C 11/1673; G11C 11/1675; G11C 2013/005; G11C 2013/009; G06N 3/0635; G06N 3/063; G06N 3/04
See application file for complete search history.

(56) References Cited

U.S. PATENT DOCUMENTS

| | | | |
|---|---|---|---|
| 2018/0260696 A1* | 9/2018 | Suda | G06N 3/0635 |
| 2019/0158097 A1* | 5/2019 | Lu | H04Q 11/00 |
| 2019/0318232 A1* | 10/2019 | Cruz-Albrecht | G06N 3/0635 |

* cited by examiner

*Primary Examiner* — David Lam
(74) *Attorney, Agent, or Firm* — Novick, Kim & Lee, PLLC; Jae Youn Kim; Jihun Kim

(57) ABSTRACT

A memory apparatus includes a memory array including a plurality of memory cells capable of selectively storing logic states and a plurality of bit lines and word lines connected to the plurality of memory cells; a controller for controlling a writing step and a reading step; a writing unit; and a reading unit, wherein the controller selects one or more memory cells through the writing unit, sequentially applies a writing voltage thereto to allow the logic states to be written therein, and applies a reading voltage to the one or more memory cells, which are selected to have the logic states written therein, through the reading unit so as to determine synaptic weights through a sum of currents flowing through the one or more memory cells so that the selected one or more memory cells are allowed to be recognized to operate as one synaptic element.

16 Claims, 7 Drawing Sheets

APPARATUS AND METHOD FOR CONTROLLING GRADUAL CONDUCTANCE CHANGE IN SYNAPTIC ELEMENT

TECHNICAL FIELD

The present invention relates to a memory apparatus capable of controlling a gradual conductance change in implementing a neuromorphic system. More particularly, the present invention relates to a memory apparatus in which one or more memory cells selected from a memory array are recognized to operate as one synaptic element.

BACKGROUND ART

Artificial intelligence semiconductor industry may be spoken as being in its embryonic stage. Semiconductor design and manufacturing companies recently start to release test products or products of early version. These test products or products of early version are all the CMOS-based first generation artificial intelligence semiconductor products, and are not different from the existing semiconductor products from the perspective of a material. Therefore, it is expected that a new material will be introduced and utilized in the second generation artificial intelligence semiconductor.

For the second generation artificial semiconductor having the degree of integration similar to a biological neural network, an artificial synapse that has all the essential characteristics of a biological synapse is required to be implemented as one element. A synapse of a biological system is accompanied with a change in synaptic weight in a procedure for processing a signal delivered from a neuron, and exhibits learning and storage functions through the same. Accordingly, an artificial synaptic element aims to simulate the biological synapse to output a change in synaptic weight as a current (or resistance) so as to exhibit learning and storage functions. To this end, it is very important to develop an element in which a controllable and distinguishable gradual current (or resistance) change occurs. In the most ideal artificial synaptic element, the gradual current (or resistance) change may occur in proportion to the number of applied pulses accurately.

In order to achieve this purpose, various artificial synaptic elements have been proposed and manufactured. In a technology that has been researched in the semiconductor field for manufacturing the synaptic element, a low resistance state is distinguished from a high resistance state in a memory array such as an RRAM, a PRAM, or an MRAM in which the resistance may be changed, and information on the distinguished states is stored in each cell. Research has been performed in a direction in which a high resistance change in a digital on or off type is implemented and a logic state of the cell in the memory array is read according to such a resistance change.

However, in order to implement the artificial synaptic element, not only one element is required to have various resistance states, but the resistance states are also required to be controllable. Researches and developments on such an element using the above-described RRAM or PRAM element are underway, but the developed results are asymmetric and lack reproducibility. In addition, it is not enough to make a distinguishable resistance state and perform simultaneous control.

INVENTION OF THE INVENTION

Technical Problem

An object of the present invention is to provide a memory apparatus capable of causing a gradual resistance change for information processing in an analog manner to a synaptic element for implementing a neuromorphic system.

Technical Solution

To achieve the above object, an aspect of the present invention provides a memory apparatus including: a memory array including a plurality of memory cells capable of selectively storing logic states and a plurality of bit lines and word lines connected to the plurality of memory cells; a controller for controlling a writing step and a reading step; a writing unit; and a reading unit, wherein the controller selects, in the writing step, one or more memory cells from among the plurality of memory cells through the writing unit, sequentially applies a writing voltage thereto to allow the logic states to be written therein, and applies, in the reading step, a reading voltage to the one or more memory cells, which are selected to have the logic states written therein, through the reading unit so as to determine synaptic weights through a sum of currents flowing through the one or more memory cells so that the selected one or more memory cells are allowed to be recognized to operate as one synaptic element.

Another aspect of the present invention provides a method for determining a synaptic weight in a memory apparatus including a memory array including a plurality of memory cells capable of selectively storing logic states, bit lines and word lines connected to the plurality of memory cells, the method including: (a) selecting one or more memory cells from among the plurality of memory cells, and sequentially applying a writing voltage to write logic states therein; (b) applying a reading voltage to the one or more memory cells that has been selected to have the logic states written therein; and (c) determining, by the applied reading voltage, a synaptic weight through a sum of currents flowing through the one or more memory cells that has been selected to have the logic states written therein, wherein the selected one or more memory cells are recognized to operate as one synaptic element.

Advantageous Effects

According to the present invention, a synaptic element capable of controlling a gradual resistance change through a highly linear proportion through a method for determining a synaptic weight may be provided in the memory apparatus and the memory array.

MODE FOR CARRYING OUT THE INVENTION

Hereinafter configurations and operations of embodiments of the present invention will be described with accompanying drawings. In the following description, detailed descriptions of well-known functions or constructions will be omitted since they would obscure the invention in unnecessary detail. In addition, when an element is referred to as "comprising" or "including" a component, it does not preclude another component but may further include the other component unless the context clearly indicates otherwise.

Figure 1:
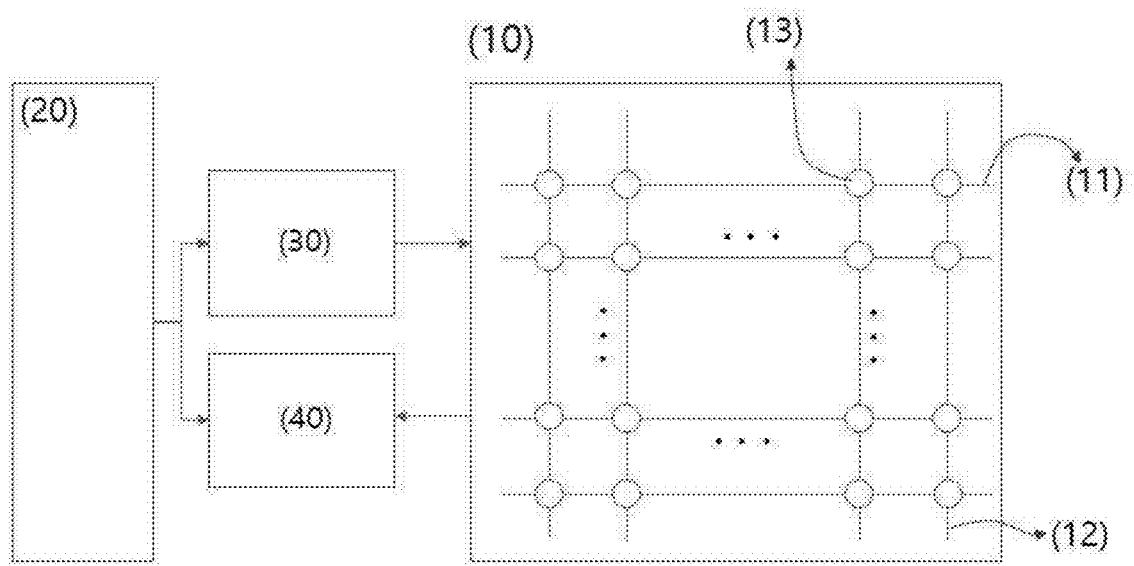
FIG. 1 illustrates a configuration diagram of a memory apparatus according to the present invention.

According to the present invention, a memory apparatus is provided which includes a memory array including a plurality of memory cells, each of which being able to selectively store a logic state, bit lines and word lines connected to the plurality of memory cells, a controller for controlling a writing step and a reading step, a writing unit, and a reading unit, wherein, in the writing step, the controller selects one or more memory cells from among the plurality of memory cells through the writing unit, and sequentially applies writing voltages to write logic states. In the reading step, the controller applies a reading voltage to one or more cells that are selected by the reading unit to have the logic states written therein, and determines synaptic weights through the sum of currents flowing through the memory cells. Accordingly, the selected one or more memory cells are caused to be recognized to operate as one synaptic element As illustrated in FIG. 1, the memory array 10 may have a cross-point structure in which the word lines 11 that are horizontal address lines and the bit lines 12 that are vertical address lines are disposed in a grid structure, and the memory cells 13 are disposed at cross points of the word lines 11 and the bit lines 12. However, this is for convenience of explanation and the present invention is not limited thereto.

The controller 20 selects, through the writing unit 30, a part of the plurality of memory cells 13 from the memory array 10 of the cross point structure, and sequentially applies a voltage to the selected memory cells to program logic states. The number of the selected memory cells may be determined according to a weight of the synaptic element. For example, when the memory cell may store a logic state of one bit and 128 synaptic weights are necessary, 128 memory cells are selected. When the selected 128 memory cells are turned on, a current is flowed to read 128 synaptic weights in the reading step. In addition, in case where 256 synaptic weights are necessary, 256 memory cells are selected and these selected memory cells are programmed to be on state in the writing step. Then, 256 synaptic weights may be read in the reading step.

Figure 2A:
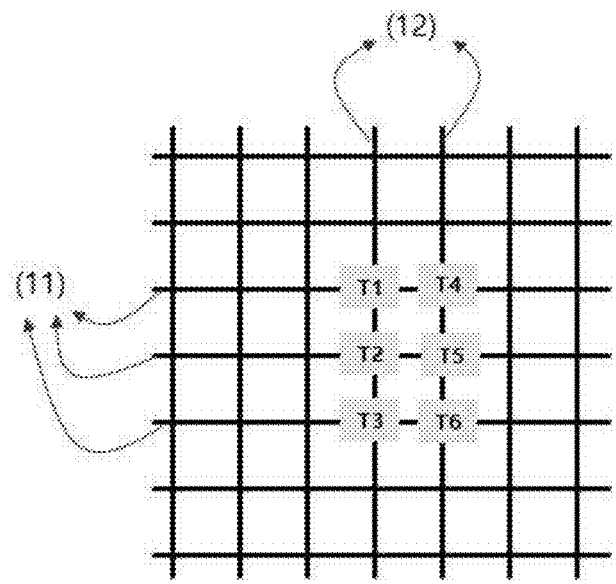
FIG. 2A and FIG. 2B illustrate an example in which a plurality of memory cells are selected in a memory apparatus according to the present invention.
Figure 2B:
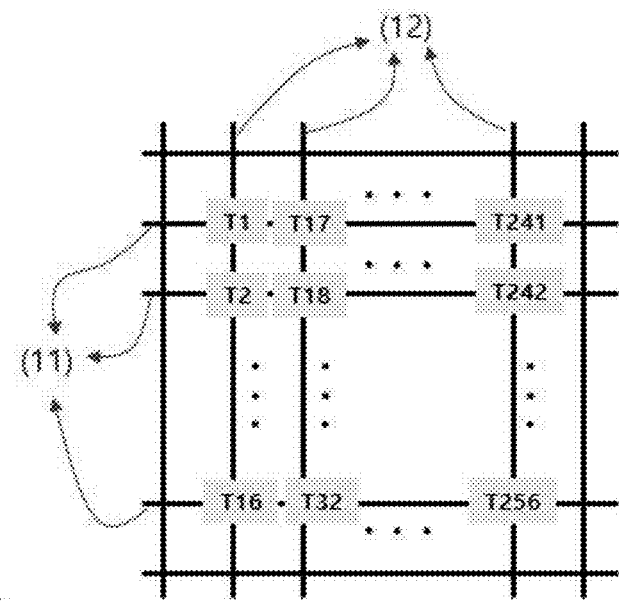

An example of the memory cells selected in this way is shown in FIG. 2. FIG. 2A illustrates that 6 memory cells (T1 to T6) positioned at a 3×2 matrix in the memory array 10 are selected to form one synaptic element, and FIG. 2B illustrates that one synaptic element is formed through 256 memory cells (T1 to T256) positioned in a 16×16 matrix.

The synaptic element in FIG. 2B may represent 256 synaptic weights. Since it is preferable that there are 256 synaptic weights in order to implement an accurate image for input image information in processing image information, it is very important to represent such synaptic weights.

In addition, the number of the selected memory cells may be preferably $2^n$ on the basis of the binary system based in a computer. Accordingly, the number of selected memory cells is preferably one among 1, 2, 4, 8, 16, 32, 64, 128, 256, 1024, or 2048. When the number of memory cells exceeds 2048, the number of memory cells selected from the array becomes too many and a control therefor becomes difficult. Therefore, the number of memory cells may be preferably 2048 or smaller.

In the reading step, the total sum of the currents is measured which flow through the memory array 10 by a voltage applied to the memory array 10, and the synaptic weights in the memory array 10 may be determined through this total sum. The total sum of the currents becomes differed according to the number of memory cells that are selected in this way to have logic states written therein, and the synaptic weights may be determined in various ways.

Figure 3:
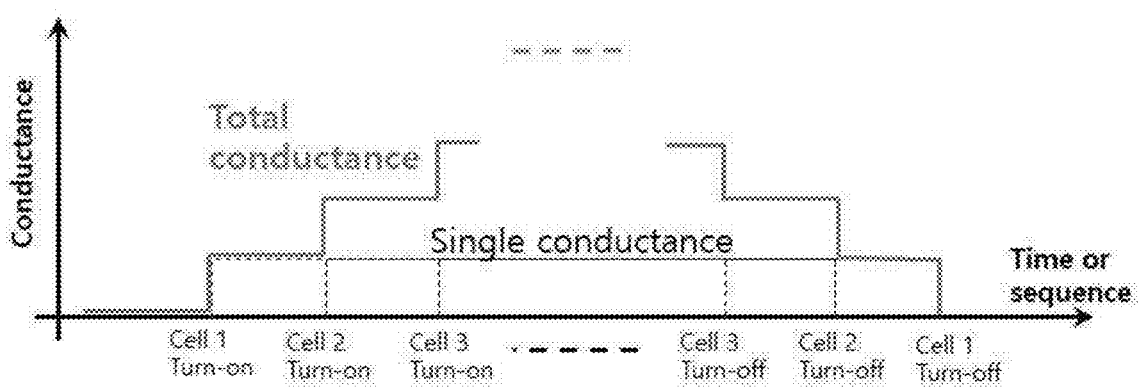
FIG. 3 illustrates that a gradual conductance change occurs in a memory apparatus according to the present invention.

Such a current (conductance) change is shown in FIG. 3. In the memory apparatus according to the present invention, the total sum of the currents gradually changes according to the number of the selected memory cells, and the change is linearly proportional to the number of the selected memory cells. Since also having the excellent symmetry when the conductance rises and falls, the memory cells are suitable to be applied as a synaptic element.

In addition, the plurality of memory cells capable of storing the logic states in the present invention may be a memory apparatus capable of storing a logic state of one bit or more. When the logic state is not just on or off, but has several stages, a large synaptic weight may be represented even when the number of memory cells is small. For example, when each memory cell represents only on or off, the number of selected memory cells, which is required to represent 256 synaptic weights, is 256. On the other hand, when the memory cell is formed of a variable resistance element and may represent a four-stage resistance state, the 256 synaptic weights may be represented with 64 memory cells.

Each of the plurality of memory cells, which may store the logic state, may include a non-volatile memory element and a selector element. The non-volatile memory is necessary so as to store the logic state at low power in a memory cell, and each of the memory cells 13 requires to include the selector element in order to sequentially select memory cells and write the logic states thereto in the writing step, and measure the sum of the currents flowing through the programmed memory cells in the reading step.

The non-volatile memory element may be any one among a Flash Memory, a resistive random access memory (RRAM), phase change random access memory (PRAM), or a magnetic random access memory (MRAM). In particular, the non-volatile memory element may be a variable resistance element such as an RRAM, a PRAM, or an MRAM. This variable resistance element may represent various resistance states according to an applied writing voltage and/or current pulse, and store the logic states of one or more bits through the same.

Furthermore, the selector element may be any one among a transistor, a diode, or a two-terminal switching element. Each memory cell may be individually selected through the selector element included therein to pass the writing and reading steps.

In particular, the selector element may be a two-terminal switching element. Application of the two-terminal switching element as the selector element for selecting the memory cell may raise the degree of integration and reduce power consumption. The two-terminal switching element may be any one among an Ovonic threshold switch, a transition metal oxide switch, a mixed ionic electronic conductor (MIEC) switch, a complementary resistance switch, or a doped amorphous silicon.

In addition, the plurality of memory cells in the present invention may include a selective memory element that may store the logic state. The selective memory element means an element having both the non-volatile memory characteristics and the selector element characteristics.

A chalcogenide material without a phase change may also be a variable resistance element, and have unique switch characteristics that cause a constant resistance change to occur around a threshold voltage.

In this way, when a variable resistance element is used which includes a chalcogenide material without a phase change like the existing Ovonic threshold switch element, one or more memory cells may be selected through the switching characteristics and each logic state may be stored through the variable resistance characteristics.

Such an element may be represented as a selective memory element, and in this case, an additional memory element or a selector element is not necessary. Accordingly, a high density memory apparatus is enabled and power consumption may be reduced. As such a chalcogenide material, an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, a Si—Ge—As—Se alloy, a Si—Te—As—Ge alloy, an In—Sb—Te alloy, an In—Sb—Se alloy, an In—Ge—As alloy, an In—Ge—Te alloy, an In—Te alloy, or the like may be used. However, besides the above-described materials, a material through which a logic state may be stored and a switching function is enabled according to a resistance change is also adoptable.

An example of the memory cell 13 as described above is illustrated in FIG. 4. For reference, the shape and configuration of each memory cell may be modified in various ways. For example, the selector element or the memory element may be omitted, or an electrode may be omitted. Alternatively, positions of the selector element and the memory element may be switched.

Figure 4A:
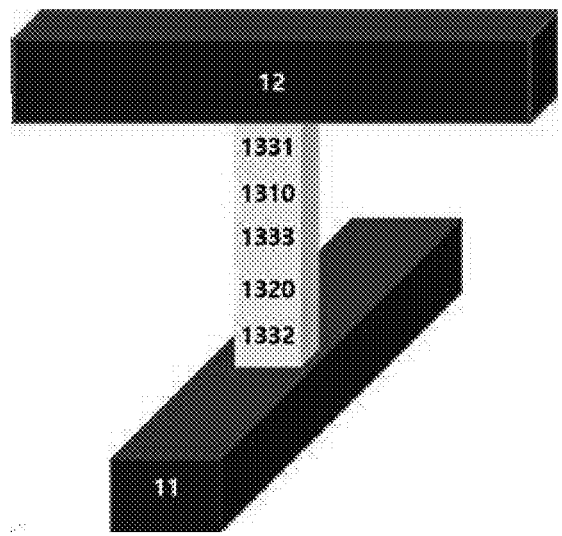
FIG. 4A and FIG. 4B illustrate a configuration example of a memory cell applied to a memory apparatus according to the present invention.

FIG. 4A illustrates a memory cell including a memory element and a selector element. A word line 11, which is one among access lines to the memory cell, vertically passes the plane and a bit line 12 passes the plane in parallel. A memory cell 13 is disposed between these vertically crossing the word line 11 and the bit line 12. Electrodes 1331 and 1332 are disposed between the memory element 1310 and the selector element 1320 connected with the word line 11 and the bit line 12. Between the electrodes 1331 and 1332, the memory element 1310, the selector element 1320, and an electrode 1333 for connecting therebetween are included. The memory element 1310 of the memory cell 13 may be any one among non-volatile memories such as a flash memory, an RRAM, a PRAM, or an MRAM, and the selector element 1320 may be any one among a transistor, a diode, or a two-terminal switching element. For example, the memory element 1310 may be any one among a flash memory, an RRAM, a PRAM, or an MRAM, and the selector element 1320 may be a transistor. As another example, the memory element 1310 may be any one among a RRAM, a PRAM, or an MRAM, and the selector element 1320 may be a two-terminal switching element. Here, the two-terminal switching element may be an Ovonic threshold switch.

Figure 4B:
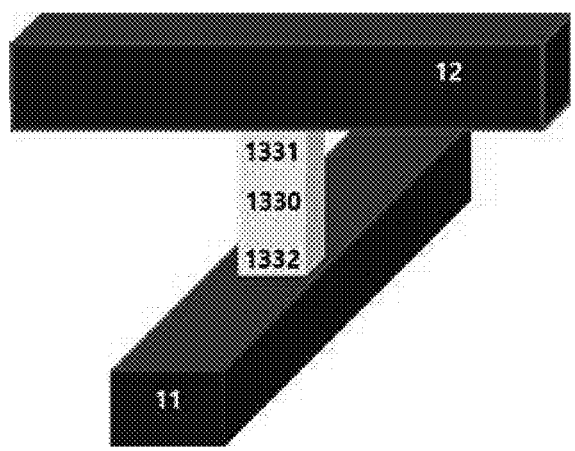

In addition, the memory cell 13 may include a selective memory element. FIG. 4B illustrates an example that the memory cell 13 includes a selective memory element 1330 and electrodes 1331 and 1332. The selective memory element 1330 may have a chalcogenide material without a phase change, through which a memory cell is enabled to be selected using unique switching characteristics and a logic state may be written using variable resistance characteristics that appear according to a writing condition. An example of this selective memory element 1330 may be an Ovonic threshold switching element including the chalcogenide material. Although being typically connected with an RRAM, PRAM or the like to be used as a selector element, the Ovonic threshold switching element may be solely used to exhibit both the variable resistance characteristics and a selection function. The chalcogenide material may be an alloy including In—Ge—As—Se.

In addition, the writing unit 30 according to the present invention is a memory apparatus including a DC counter. The controller 20 sequentially selects one or more memory cells from the memory array 10 through the writing unit 30 that includes the DC counter, and sequentially programs logic states. There may be one or more DC counters.

Furthermore, according to the present invention, the reading unit 40 provides a memory apparatus including an analog-to-digital converter ADC. The ADC is a device for converting a consecutive physical amount into a digital value, and, by using the ADC, the controller 20 may determine the synaptic weights through the flow of the current flowing through the entire memory array 10.

The one or more memory cells, which have been selected to have logic states programmed therein in the writing step, may be a memory apparatus in which all the memory cells are connected to one bit line among the bit lines. When the selected memory cells are connected to the one bit line and only a current flowing through the connected bit line is measured, a current flowing through the entire memory array may be measured, which is efficient in terms of apparatus configuration.

In addition, the present invention may provide a memory apparatus in which the one or more cells, which have been selected to have the logic states programmed therein in the writing step, are connected with one of the word lines. Similarly, only a current flowing through the connected word line may be measured, which is highly efficient in terms of apparatus configuration.

FIG. 5 illustrates configuration examples of various synaptic elements. These are only for convenience of explanation, and the present invention is not limited thereto. The numbers of column lines and row lines included in the memory cell array may be changed as necessary.

Figure 5A:
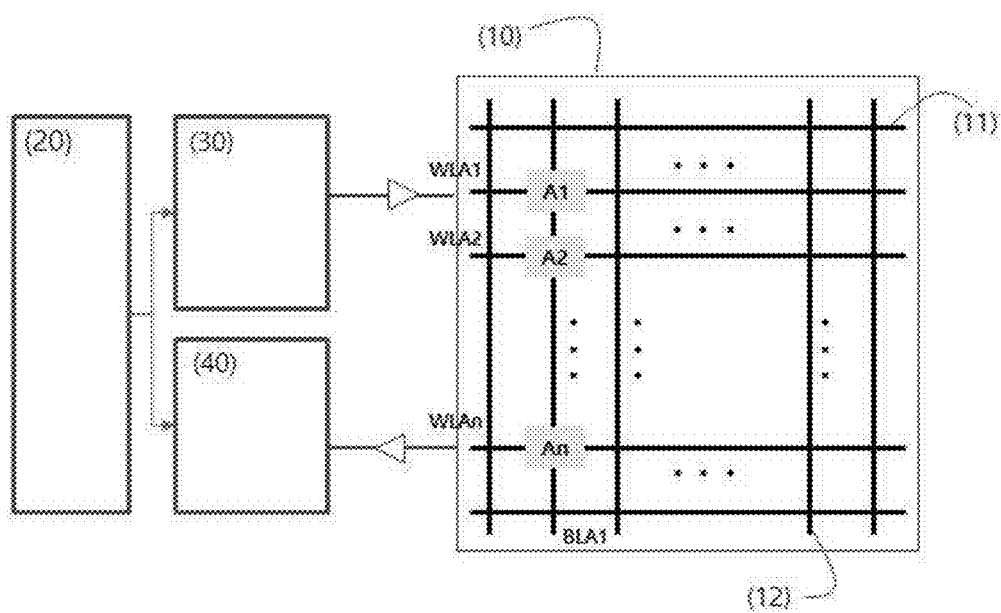
FIG. 5A to FIG. 5C illustrate an example in which a plurality of memory cells are selected in a memory apparatus according to the present invention.

FIG. 5A shows a structure in which memory cells that are selected to have the logic states written therein, namely, the memory cells A1 to An forming one synaptic element are all connected to one identical bit line BLA1. In this way, when the memory cells A1 to An forming one synaptic element are connected to one bit line, the controller 20, in the writing step, applies a voltage through a plurality of word lines WLA1 to WLAn and one bit line BLA1 to have the logic states sequentially stored in the memory cells A1 to An. The writing unit 30 may cause the voltage to be sequentially applied to the memory cells A1 to An through the DC counter so that the logic states are written therein. Here, one or more DC counters may be connected to the word lines to which the memory cells A1 to An are connected, and control selective writing.

Thereafter, in the reading step, the controller 20 causes the reading unit 40 to determine the synaptic weights through the sum of the currents flowing through the memory cells A1 to An, namely, the synaptic elements. The reading unit 40 may include an ADC to measure the sum of the currents at one time, and when the selected cells are all connected to one bit line, the ADC may be connected to the bit line to assist the sum of the currents to be measured. Such an ADC may be a sense amplifier.

Figure 5B:
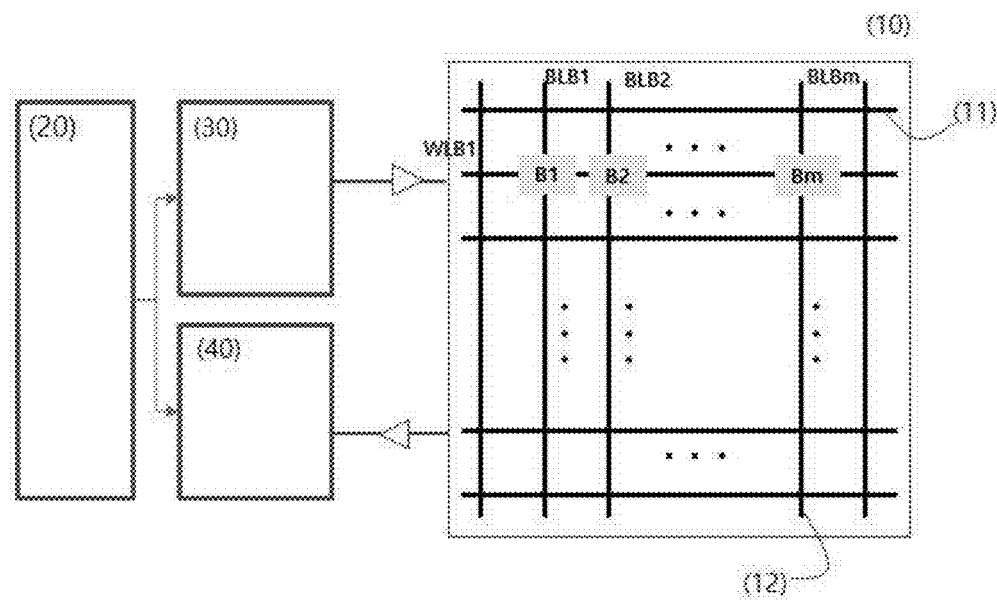

FIG. 5B shows a structure in which memory cells that are selected to have the logic states written therein, namely, memory cells B1 to Bm forming one synaptic element are all connected to one identical word line WLB1. In this way, when the memory cells B1 to Bm forming one synaptic element are connected to one word line, the controller 20, in the writing step, applies a voltage through a plurality of bit lines BLB1 to BLBm and one word line WLB1 to have the logic states sequentially stored in the memory cells B1 to Bm. The writing unit 30 may cause the voltage to be sequentially applied to the memory cells B1 to Bm through the DC counter so that the logic states are written therein. Here, one or more DC counters may be connected to the bit lines to which the memory cells B1 to Bm are connected, and control selective writing. Thereafter, in the reading step, the controller 20 causes the reading unit 40 to determine the synaptic weights through the sum of the currents flowing through the memory cells B1 to Bm, namely, the synaptic elements. The reading unit 40 may include an ADC to measure the sum of the currents at one time, and when the selected cells are all connected to one word line, the ADC may be connected to the word line to assist the sum of the currents to be measured. Such an ADC may be a sense amplifier.

Figure 5C:
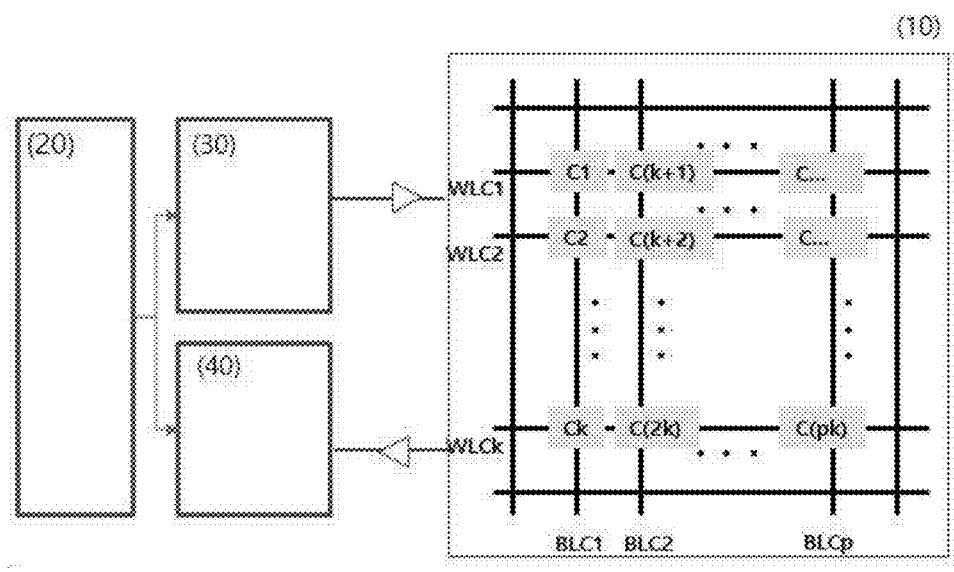

FIG. 5C shows a structure in which memory cells that are selected to have the logic states written therein, namely, memory cells C1 to Cpk forming one synaptic element are all connected to a plurality of word lines and a plurality of bit lines. In this way, with respect to the memory cells C1 to Cpk forming one synaptic element, the controller 20, in the writing step, sequentially applies a voltage through a plurality of word lines WLC1 to WLCk and a plurality of bit lines BLC1 to BLCp that are connected to the memory cells C1 to Cpk, and has the logic states stored in the memory cells C1 to Cpk. The writing unit 30 may cause the voltage to be sequentially applied to the memory cells C1 to Cpk through the DC counter and write the logic states therein. Here, one or more DC counters may be connected to the bit lines and the word lines to which the memory cells C1 to Cpk are connected, and control selective writing. Thereafter, in the reading step, the controller 20 causes the reading unit 40 to measure the sum of currents flowing through the memory cells C1 to Cpk, namely, synaptic elements so as to determine synaptic weights. The reading unit 40 may include an ADC to measure the sum of the currents at one time, and when the selected cells are connected to a plurality of word lines and bit lines, the ADC may also be connected to the word lines and the bit lines to assist the sum of the currents to be measured. Such an ADC may be a sense amplifier.

The present invention provides a method for determining synaptic weights, in a memory apparatus including a memory array provided with a plurality of memory cells that may selectively store logic states, and bit lines and word lines connected to the plurality of memory cells, the method including: (a) a step for selecting one or more memory cells from among the plurality of memory cells, and sequentially applying a writing voltage to write logic states therein; (b) a step for applying a reading voltage to the one or more memory cells that have been selected to have the logic states written therein; and (c) a step for determining synaptic weights through the sum of currents flowing through the one or more memory cells that have been selected to have the logic states written therein, wherein the selected one or more memory cells are recognized to operate as one synaptic element.

In a memory array of a cross point structure, one or more memory cells are selected, logic states are written therein, synaptic weights are determined through the sum of currents flowing through the memory cells that are selected to have the logic states written therein in this way, and thus the selected one or more memory cells may be recognized to operate as one synaptic element.

The number of the selected memory cells may be determined according to a weight of the synaptic element. For example, when a memory cell may store one bit logic state and 128 synaptic weights are necessary, 128 cells are selected and the selected 128 cells are turned on. Then, 128 synaptic weights may be read by causing a current to flow through the 128 cells in the reading step. Similarly, when 256 synaptic weights are necessary, 256 cells are selected and turned on in the writing step. Then in the reading step, 256 synaptic weights may be read.

Meanwhile, a memory cell may be a memory apparatus capable of storing one bit or more logic states. When the logic state is not simply on or off but has multiple stages, a larger synaptic weight may be represented even when the selected number of memory cells is small. For example, when each memory cell represents only on or off, the number of the selected memory cells required to represent 256 synaptic weights is 256. On the other hand, when the memory cell is formed of a variable resistance element and may represent a four-stage resistance state, 256 synaptic weights may be represented with 64 memory cells.

In addition, in the present invention, one or more memory cells capable of selectively storing the logic states provide, in a memory apparatus including a two-terminal switching element or a selective memory element, a method for determining synaptic weights, wherein, in the above-described step (b), the reading voltage is in a range in which all the one or more memory cells, which has been selected to have the logic states written therein, are not turned on, and which is larger than a voltage applied to one or more memory cells that are not selected from the memory array.

The two-terminal switching element or the selective memory element has a switching function in which a large resistance change occurs, when a voltage equal to or greater than a certain level is applied. A voltage causing a change in resistance in this two-terminal switching element or selective memory element is expressed as a threshold voltage, and a phenomenon in which the resistance change occurs is expressed as being turned on.

A typical reading procedure in which a switching function is used in a memory array of a cross point structure like the present invention is performed by causing only a very low current to flow through a cell that is not selected at a threshold voltage or lower using the characteristics of a switching element, and by applying, to a selected cell, a voltage that may allow a logic state of the cell to be distinguished.

Figure 6:
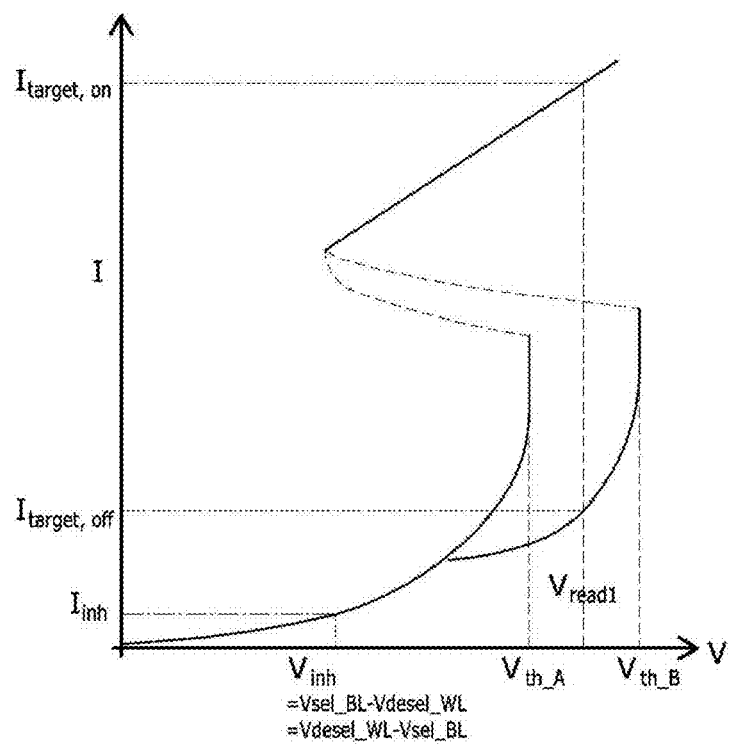
FIG. 6 illustrates a typical reading method for a memory array of a cross-point structure in which a memory cell having a switching function is included.

A typical method for reading currents of selected cells in a memory array of a cross point structure including a two-terminal switching element or a selective memory element will be described through FIG. 6. In FIG. 6, when $V_{inh}$ is applied to the cells that are not selected, in this region, cells having high resistance are not distinguished from cells having low resistance and the flow of a current is very small. Meanwhile, $V_{read1}$ is applied to the selected cells, and $V_{read1}$ is caused to be $V_{th\_a}<V_{read1}<V_{th\_B}$, where $V_{th\_A}$ is a threshold voltage of the cells having low resistance, $V_{th\_B}$ is a threshold voltage of the cells having high resistance, and the logic state is allowed to be distinguished by means of a current flowing through the selected cells. In FIG. 6, according to $V_{read1}$, a current $I_{target,off}$ flows through the cells having the high resistance and a current $I_{target,on}$ flows through the cells having the low resistance. This method may allow only one cell to be selected from the memory array and allow only an on or off state in a digital type to be read. This is because, when the reading voltage is applied to one cell that is in a turned-on state, a current flowing through the cell is so large that current measurement for other cells is not possible.

Figure 7:
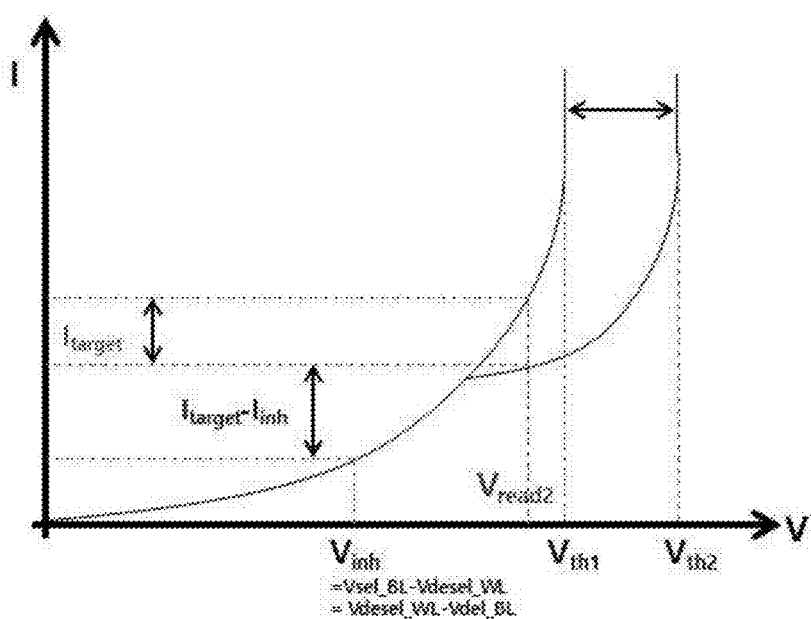
FIG. 7 illustrates a reading method according to the present invention for a memory array of a cross-point structure in which a memory cell having a switching function is included.

Another method for reading the currents of the selected memory cells will be described with reference to FIG. 7. When $V_{inh}$ is applied to the cells that are not selected, in this area, current flows according to resistance states of the cells are not distinguished from each other and the currents are very small. Meanwhile, unlike the above-described method for applying, to the selected cells, the reading voltage $V_{read1}$ ($V_{th\_A}<V_{read1}<V_{th\_B}$) between the threshold voltage $V_{th\_A}$ of the cells having the low resistance and the threshold voltage $V_{th\_B}$ of the cells having the high resistance, as shown in FIG. 7 with '$V_{read2}$', the reading voltage is within a voltage range of a sub-threshold region in which all the selected one or more cells are not turned on and within a range larger than the voltage applied to the one or more cells that are not selected. In other words, in FIG. 7, the reading voltage $V_{read2}$ is larger than $V_{inh}$ and in a range smaller than the threshold voltage $V_{th1}$ of a cell that is in a lowest resistance state among the selected cells. In this way, when the reading is performed in the sub-threshold region, simultaneous reading for multiple cells also becomes possible. This is because, unlike the typical method, even when the reading voltage is applied to a cell in an on state, a current flowing through the cell is not large and thus the sum of currents flowing through multiple cells may be easily measured by applying the reading voltage to the multiple cells simultaneously.

In the present invention, the two-terminal switching element may be any one among an Ovonic threshold switching element, a transition metal oxide switching element, a mixed ion-electron conductor switching element, a complementary resistance switching element, and doped amorphous silicon. Besides the above-described materials, a material in which a switching function is enabled which causes a resistance change on the basis of a threshold voltage is also adoptable.

Alternatively, the selective memory element means an element having both non-volatile memory characteristics and selector element characteristics. In other words, it means to be able to store a logic state through a resistance change and also operate as a selector element by causing a resistance change on the basis of a constant voltage, namely, a threshold voltage. Such an element may be represented as a selective memory element, and in this case, an additional memory element or a selector element is not necessary. Accordingly, a high density memory apparatus is enabled and power consumption may be reduced. An example of such a selective memory element may be an Ovonic threshold switching element including a chalcogenide material. This is because the chalcogenide threshold switching element may be solely utilized to show both the variable resistance characteristics and the selection function, although typically being connected with an RRAM, PRAM or the like to be used as a selector element. As the chalcogenide material, an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, a Si—Ge—As—Se alloy, a Si—Te—As—Ge alloy, an In—Sb—Te alloy, an In—Sb—Se alloy, an In—Ge—As alloy, an In—Ge—Te alloy, an In—Te alloy, or the like may be used. However, besides the above-described materials, a material through which a logic state may stored and a switching function is enabled by a resistance change is also adoptable.

In addition, the plurality of memory cells capable of selectively storing the logic states provide, in a memory apparatus including a two-terminal switching element or a selective memory element, a method for determining synaptic weights, wherein, in the above-described step (a), the writing voltage turns on the one or more memory cells selected from among a plurality of memory cells and has a first polarity for writing a first logic state and a second polarity for writing a second logic state, the first polarity and the second polarity being opposite to each other, and in the above-described step (b), the reading voltage has the same polarity as the first polarity of the writing voltage, wherein the selected one or more selected memory cells are caused to be recognized to operate as one synaptic element.

When a voltage of the first polarity, which is equal to or higher than the threshold voltage, is applied to a memory cell including the two-terminal switching element or the selective memory element, and then the voltage of the first polarity is applied thereto, the memory cell has a low threshold voltage in a direction of the first polarity to show a low resistance state. Initially, even in case of having a high threshold voltage of the first polarity and being in a high resistance state, when a voltage of the first polarity equal to or greater than the threshold voltage is applied, the memory cell also becomes a low resistance state. In addition, when a voltage equal to or greater than the threshold voltage, which has the second polarity opposite to the first polarity, is applied to the memory cell, and then the voltage of the first polarity is applied, the memory cell has a high threshold voltage in a direction of the first polarity and shows a high resistance state. Even in case of having the first polarity and being in a low resistance state before a voltage of the second polarity is applied, when the threshold voltage or higher of the second polarity is applied, the memory cell becomes to have a high threshold voltage in the first polarity direction.

Figure 8A:
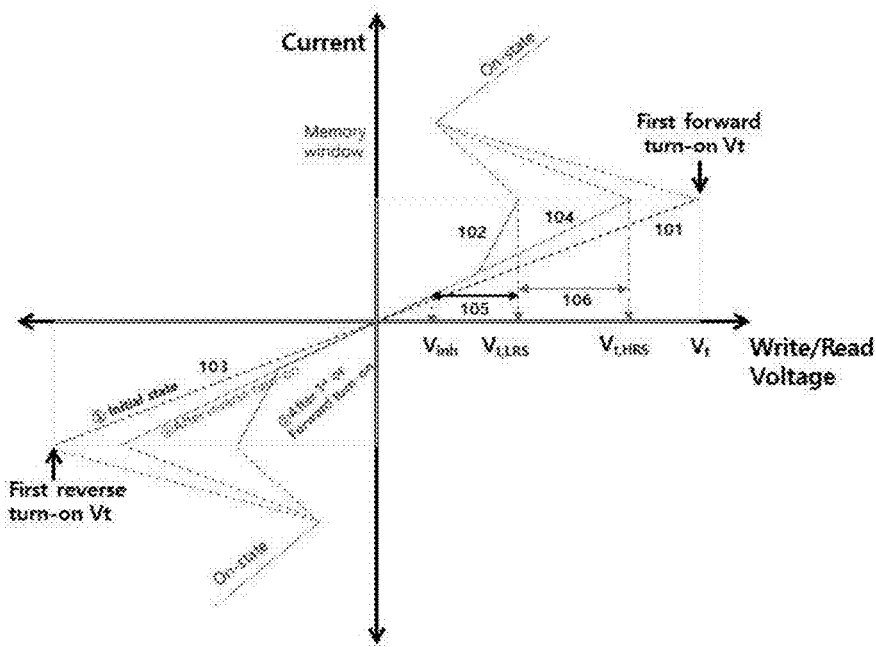
FIG. 8A and FIG. 8B illustrate a writing and reading method according to the present invention for a memory array of a cross-point structure in which a memory cell having a selective memory element is included.
Figure 8B:
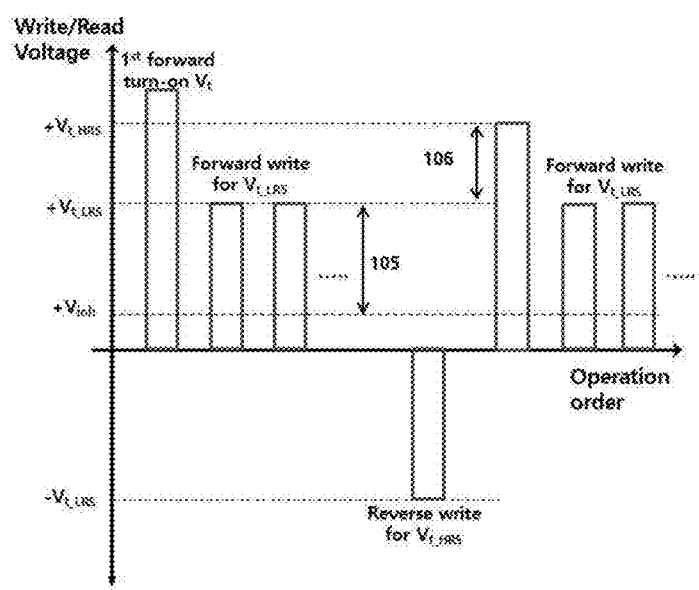

This is shown in FIG. 8. In the voltage-current graph in FIG. 8A, when a first forward turn-on voltage $V_t$ of the first polarity (+) is applied along a line 101 and then a reading voltage of the same first polarity (+) is applied, the memory cell has a low threshold voltage $V_{t,LRS}$ along a line 102, in other words, a low resistance state. However, when a voltage equal to or greater than the threshold voltage, which has the second polarity (−), is applied along a line 103 having the opposite polarity of the first polarity (+), and then the reading voltage of the first polarity (+) is applied, the memory cell shows a high threshold voltage $V_{t,HRS}$ along a line 104 to have a high resistance state. In this way, as the polarity of the writing voltage is differed in the writing step, the resistance state becomes different and the resistance difference may be shown through a memory window 106 in FIGS. 8A and 8B. Thereafter, in the reading step, as the above-described, the currents flowing through the selected memory cells may be measured to determine the synaptic weights by applying the reading voltage within a range 105 in which the memory cells are not turned on and which is larger than a voltage applied to the one or more cells that are not selected from the memory array.

In the present invention, a method for determining synaptic weights may be provided in which one or more memory cells that are selected to have the logic states written therein are memory cells all connected to one bit line among the bit lines. In addition, in the present invention, a method for determining synaptic weights may be provided in which the one or more memory cells that are selected to have the logic states written therein are memory cells all connected to one word line among the word lines. The memory cells selected in this way are connected to one word line or one bit line, which is efficient in terms of apparatus configuration.

Furthermore, the present invention provides a method for determining synaptic weights in which the number of one or more memory cells, which are selected to have the logic states written therein in the (a) step, is any one among 1, 2, 4, 8, 16, 32, 64, 128, 256, 1024, and 2048, wherein the selected one or more memory cells are recognized to operate as one synaptic element. This is because the number of selected cells is preferably $2^n$ on the basis of the binary system that is based in a computer. Accordingly, the number of selected cells is preferably any one among 1, 2, 4, 8, 16, 32, 64, 128, 256, 1024, and 2048. In case of exceeding 2048, the number of the cells selected from the array is too many, and thus a control therefor becomes difficult. Thus the number of the selected cells is preferably 2048 or smaller.

What is claimed is:

1. A memory apparatus comprising:
    a memory array comprising a plurality of memory cells capable of selectively storing logic states and a plurality of bit lines and word lines connected to the plurality of memory cells;
    a controller for controlling a writing step and a reading step;
    a writing unit; and
    a reading unit,
    wherein the controller is configured to select, in the writing step, two or more memory cells as one synaptic element from among the plurality of memory cells through the writing unit, sequentially apply a writing voltage thereto to allow the logic states to be written therein, and apply, in the reading step, a reading voltage to the two or more memory cells, which are selected to have the logic states written therein, through the reading unit so as to determine synaptic weights through a sum of currents flowing through the two or more memory cells so that the selected two or more memory cells are allowed to be recognized to operate as the one synaptic element.

2. The memory apparatus of claim 1, wherein the plurality of memory cells capable of selectively storing the logic states are able to respectively store a logic state of one bit or more.

3. The memory apparatus of claim 1, wherein each of the plurality of memory cells capable of selectively storing the logic states comprises a non-volatile memory and a selector element, and the selector element is any one among a transistor, a diode, or a two-terminal switch.

4. The memory apparatus of claim 1, wherein the plurality of memory cells capable of selectively storing the logic states comprises selective memories.

5. The memory apparatus of claim 1, wherein the writing unit comprises a DC counter.

6. The memory apparatus of claim 1, wherein the reading unit comprises an analog-to-digital converter.

7. The memory apparatus of claim 1, wherein the two or more memory cells which are selected to have the logic states written therein in the writing step are memory cells all connected to one bit line among the bit lines.

8. The memory apparatus of claim 1, wherein the two or more memory cells which are selected to have the logic states written therein in the writing step are memory cells all connected to one word line among the word lines.

9. The memory apparatus of claim 1, wherein the number of the two or more memory cells that are selected to have the logic states written therein in the writing step is any one among 1, 2, 4, 8, 16, 32, 64, 128, 256, 1024, or 2048.

10. A method for determining a synaptic weight in a memory apparatus including a memory array including a plurality of memory cells capable of selectively storing logic states, and a plurality of bit lines and word lines connected to the plurality of memory cells, the method comprising:
    (a) selecting two or more memory cells as one synaptic element from among the plurality of memory cells, and sequentially applying a writing voltage to write logic states therein;
    (b) applying a reading voltage to the two or more memory cells that have been selected to have the logic states written therein; and
    (c) determining, by the applied reading voltage, a synaptic weight through a sum of currents flowing through the two or more memory cells that have been selected to have the logic states written therein,
    wherein the selected two or more memory cells are recognized to operate as the one synaptic element.

11. The method of claim 10, wherein each of the plurality of memory cells capable of selectively storing the logic states is a memory cell capable of storing a logic state of one or more bits.

12. The method of claim 10, wherein the plurality of memory cells capable of selectively storing the logic states comprises a two-terminal switch or a selective memory apparatus, and
    the reading voltage in step (b) is in a range in which all the two or more memory cells, which have been selected to have the logic states written therein, are not turned on, and is larger than a voltage applied to one or more memory cells that are not selected from the memory array.

13. The method of claim 12, wherein the writing voltage in step (a) causes the two or more memory cells selected from among the plurality of memory cells to be turned on, and has a first polarity for writing a first logic state and a second polarity for writing a second logic state, the first polarity being opposite to the second polarity, and
    the reading voltage in step (b) has a polarity identical to the first polarity of the writing voltage.

14. The method of claim 10, wherein the two or more memory cells, which are selected to have the logic states written therein, are memory cells all connected to one bit line among the bit lines.

15. The method of claim 10, wherein the two or more memory cells, which are selected to have the logic states written therein, are memory cells all connected to one word line among the word lines.

16. The method of claim 10, wherein the number of the two or more memory cells, which are selected to have the logic states written therein in step (a), is any one among 1, 2, 4, 8, 16, 32, 64, 128, 256, 1024, or 2048.

\* \* \* \* \*